(12) United States Patent
Choi et al.

(10) Patent No.: US 7,387,917 B2
(45) Date of Patent: Jun. 17, 2008

(54) BGA PACKAGE SUBSTRATE AND METHOD OF FABRICATING SAME

(75) Inventors: Jae Min Choi, Daejeon (KR); Young Hwan Shin, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 11/086,625

(22) Filed: Mar. 22, 2005

(65) Prior Publication Data
US 2006/0145345 A1 Jul. 6, 2006

(30) Foreign Application Priority Data
Dec. 30, 2004 (KR) .................. 10-2004-0116798

(51) Int. Cl.
*H01L 21/00* (2006.01)
(52) U.S. Cl. ...................... 438/125; 438/623
(58) Field of Classification Search ............... 438/125, 438/652, 118, 622, 623
See application file for complete search history.

(56) References Cited

U.S. PATENT DOCUMENTS

| | | | | |
|---|---|---|---|---|
| 5,557,844 | A * | 9/1996 | Bhatt et al. | 29/852 |
| 6,580,036 | B2 * | 6/2003 | Kim et al. | 174/261 |
| 6,884,655 | B2 * | 4/2005 | Iljima et al. | 438/107 |
| 6,972,382 | B2 * | 12/2005 | Zollo et al. | 174/262 |

OTHER PUBLICATIONS

Korean Patent Abstract for Patent No. 190622 filed on Nov. 14, 1995.
Korean Patent Abstract for Patent No. 328251 filed on Jul. 2, 1999.
Korean Patent Abstract for Patent No. 340430 filed on Aug. 31, 2000.

* cited by examiner

*Primary Examiner*—Thao X. Le
*Assistant Examiner*—Ajay K Arora
(74) *Attorney, Agent, or Firm*—Darby & Darby P.C.

(57) ABSTRACT

Disclosed is a ball grid array (BGA) package substrate, in which a wire bonding pad and a solder ball pad are formed on a via hole, making high freedom in design of a circuit pattern and a high density circuit pattern possible, and a method of fabricating the same.

6 Claims, 9 Drawing Sheets

BGA PACKAGE SUBSTRATE AND METHOD OF FABRICATING SAME

INCORPORATION BY REFERENCE

The present application claims priority under 35 U.S.C. §119 to Korean Patent Application No. 10-2004-0116798 filed on Dec. 30, 2004. The content of the application is incorporated herein by reference in its entirety.

BACKGROUND OF THE INVENTION

1. Field of the Invention

The present invention relates, in general, to a ball grid array (BGA) package substrate and a method of fabricating the same and, more particularly, to a BGA package substrate, in which a wire bonding pad and a solder ball pad are formed on a via hole, making high freedom in design of a circuit pattern and a high density circuit pattern possible, and a method of fabricating the same.

2. Description of the Prior Art

Recently, technologies with respect to a BGA package substrate have rapidly been developed so as to realize light, compact and high density microcircuit patterns in accordance with the trend toward miniaturization, high integration, and multi-functionalization of electronic goods. Particularly, the light and compact microcircuit patterns are frequently needed in CSP (chip-sized package) goods in which a semiconductor device is mounted on the BGA package substrate.

Furthermore, it is required that mobile phones, to which the CSP goods are most frequently applied, have multiple functions, in other words, it is required to continuously add novel functions to existing functions of the mobile phones. Thus, the number of signal lines of the semiconductor device is rapidly growing. With respect to this, in order to mount the semiconductor device having a large number of signal lines, it is required to increase freedom in design of the BGA package substrate.

FIGS. 1a to 1g are sectional views illustrating the fabrication of a conventional BGA package substrate, FIG. 2 is a sectional view of a conventional BGA package substrate on which a semiconductor device is mounted, and FIG. 3 illustrates a conventional inferior BGA package substrate.

As shown in FIG. 1a, after a copper clad laminate 11, in which copper foil layers 13, 13' are formed on both sides of an insulating resin layer 12, is prepared, internal layer circuit patterns are formed on the copper foil layers 13, 13' of the copper clad laminate 11. Subsequently, prepregs 14, 14' and copper foils 15, 15' are layered on both sides of the copper clad laminate 11 on which the internal layer circuit patterns have already been formed.

As shown in FIG. 1b, blind via holes (a), which connect the copper foil layers 13, 13' to the copper foils 15, 15' therethrough, are formed using a laser to achieve circuit connections between the copper foil layers 13, 13' and the copper foils 15, 15', and a through hole (b) is formed using a mechanical drill to connect the upper and lower copper foils 15, 15' to each other therethrough.

As shown in FIG. 1c, copper plating layers 16, 16' are formed on the upper and lower copper foils 15, 15', walls of the blind via holes (a), and a wall of the through hole (b) to electrically connect the blind via holes (a) to the through hole (b).

As shown in FIG. 1d, external layer circuit patterns are formed on the upper and lower copper foils 15, 15' and the copper plating layers 16, 16' using a photolithography process.

As shown in FIG. 1e, solder resists 17, 17' are applied on upper and lower sides of the resulting substrate, on which the external layer circuit patterns are formed, and then subjected to a pseudo-drying process.

As shown in FIG. 1f, openings (c) are formed through the upper solder resist 17 using a photolithography process so as to correspond to wire bonding pads, and openings (d) are formed through the lower solder resist 17' so as to correspond to solder ball pads.

As shown in FIG. 1g, gold plating layers 18 are formed on the wire bonding pads that correspond in position to the openings (c) of the upper solder resist 17, and gold plating layers 18' are formed on the wire bonding pads that correspond in position to the openings (d) of the lower solder resist 17', thereby creating the conventional BGA package substrate 10.

As shown in FIG. 2, a semiconductor device 20 is attached to the conventional BGA package substrate 10 using an adhesive 30, wire bonds 40 are formed between the wire bonding pads and the semiconductor device 20, and solder balls 50 are formed on the solder ball pads.

The fabrication of the conventional BGA package substrate 10 as described above is disclosed in Korean Patent Registration Nos. 190,622, 328,251, and 340,430.

In the conventional BGA package substrate 10, surfaces of the wire bonding pads must be even in order to form the wire bonds 40 that are connected between the semiconductor device and the wire bonding pads to connect the semiconductor to signal lines. Therefore, the wire bonding pads and the blind via holes for transmitting signals, which flow through the wire bonding pads, to circuit layers therethrough must be formed at different positions.

If the wire bonding pads are formed on the blind via holes, since exposed portions of the blind via holes are uneven in the conventional BGA package substrate 10, it is difficult to form the wire bonds 40 due to uneven surfaces of the wire bonding pads.

Therefore, the wire bonding pads and the blind via holes must be formed at different positions in the conventional BGA package substrate 10, thus large areas are wasted on the external layer circuit patterns of BGA package substrates 10 as they tend to have high density.

Additionally, in the conventional BGA package substrate 10, the solder ball pads and the blind via holes for transmitting signals, which flow through the solder ball pads, to circuit layers therethrough must be formed at different positions so as to form the solder balls 50 that are to be connected to a mother board.

If the solder ball pads are formed on the blind via holes, since it is difficult to completely remove the solder resist 17' from walls and bottoms of the blind via holes in the conventional BGA package substrate 10, adhesion strength between the exposed solder resist 17' and the solder balls 50 is poor, and thus, undesirably, the solder balls 50 are easily separated from the solder resist 17'.

Accordingly, the solder ball pads and the blind via holes must be formed at different positions in the conventional BGA package substrate 10, thus large areas are wasted on the external layer circuit patterns of BGA package substrates 10 as they tend to have high density.

To avoid the above disadvantages, a plan, in which a fill plating process is conducted to fill the blind via holes (a) in the course of forming the copper plating layers 16, 16' in FIG. 1c, is suggested.

However, the fill plating process is problematic in that since the blind via holes (a) are filled with costly chemicals, the fabrication cost of the BGA package substrate 10 increases.

In addition, the fill plating process is problematic in that voids or dimples are easily formed when sizes of the blind via holes (a) are reduced.

Furthermore, as shown in FIG. 3, the conventional BGA package substrate 10 is problematic in that voids (e) are formed in portions of the solder resists 17, 17' corresponding in position to the blind via holes (a) because the solder resists 17, 17' having high viscosity do not completely fill the blind via holes (a) when high density microcircuit patterns are required. Internal pressure of the BGA package substrate 10 increases with an increase in a temperature of the substrate during operation of the semiconductor device 20, thus the voids (e) act as a cause for the occurrence of burst of the voids (e), cracks, and interruptions in circuit patterns.

SUMMARY OF THE INVENTION

Therefore, the present invention has been made keeping in mind the above disadvantages occurring in the prior arts, and an object of the present invention is to provide a BGA package substrate, in which a wire bonding pad and a solder ball pad are formed on a via hole, making high freedom in design of a circuit pattern and a high density circuit pattern possible, and a method of fabricating the same.

Another object of the present invention is to provide a BGA package substrate, in which a void or dimple is not formed in a via hole, and a method of fabricating the same.

The above objects can be accomplished by providing a BGA package substrate. The BGA package substrate comprises a first external layer including a wire bonding pad; a second external layer including a solder ball pad; a first internal layer which is close to the first external layer; a second internal layer which is close to the second external layer; a first insulating layer interposed between the first external layer and the first internal layer; a second insulating layer interposed between the second external layer and the second internal layer; and a third insulating layer interposed between the first internal layer and the second internal layer. A first blind via hole is formed through the first insulating layer, open and connected to the first internal layer through a first wall thereof at a lower side thereof. Additionally the first blind via hole has a first closed portion connected to the wire bonding pad of the first external layer at an upper side thereof. The first wall is plated with a conductive material. A second blind via hole is formed through the second insulating layer, open and connected to the second internal layer through a second wall thereof at an upper side thereof. Furthermore, the second blind via hole has a second closed portion connected to the solder ball pad of the second external layer at a lower side thereof. The second wall is plated with the conductive material. An upper solder resist is formed on the first external layer and the first insulating layer. A first opening is formed through the upper solder resist so as to correspond to the wire bonding pad of the first external layer. A lower solder resist is formed on the second external layer and the second insulating layer. A second opening is formed through the lower solder resist so as to correspond to the solder ball pad of the second external layer.

Preferably, the wire bonding pad is formed on the first closed portion of the first blind via hole.

It is also preferable that the solder ball pad be formed on the second closed portion of the second blind via hole.

More preferably, the wire bonding pad is formed on the first closed portion of the first blind via hole, and the solder ball pad is formed on the second closed portion of the second blind via hole.

Furthermore, the present invention provides a method of fabricating a BGA package substrate. The method comprises (A) forming a first blind via hole, which is opened at a side thereof and has a closed portion at an opposite side thereof, through a copper clad laminate using a laser; (B) forming first copper plating layers on copper foil layers and on a wall of the first blind via hole of the copper clad laminate, and forming a predetermined circuit pattern on a copper foil layer and a first copper plating layer, which are close to an open portion of the first blind via hole; (C) repeating the steps (A) to (B) to prepare the other copper clad laminate which has a second blind via hole and a predetermined circuit pattern formed on a side thereof; (D) layering two copper clad laminates on both sides of an insulating layer so that open portions of the first and second blind via holes face the insulating layer, and pressing the two copper clad laminates and the insulating layer to achieve lamination; (E) forming a through hole through the copper foil layers and the first copper plating layers, which constitute external layers, of the two copper clad laminates; (F) forming second copper plating layers on the first copper plating layers and on a wall of the through hole, and forming external layer circuit patterns, which include a wire bonding pad and a solder ball pad, on the copper foil layers, the first copper plating layers, and the second copper plating layers; and (G) layering solder resists on the external layer circuit patterns, and forming openings, which correspond to the wire bonding pad and the solder ball pad, through the solder resists.

Preferably, the two copper clad laminates and the insulating layer are pressed and laminated in a vacuum chamber so that air is exhausted from the first and second blind via holes in the step (C).

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of a BGA package substrate and a method of fabricating the same according to the present invention, with reference to the drawings.

Figure 1A:
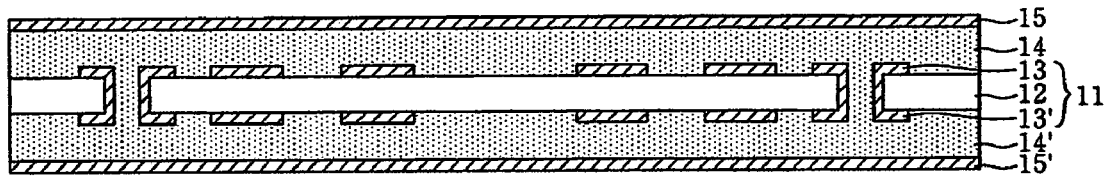
FIGS. 1a to 1g are sectional views illustrating the fabrication of a conventional BGA package substrate.
Figure 1B:
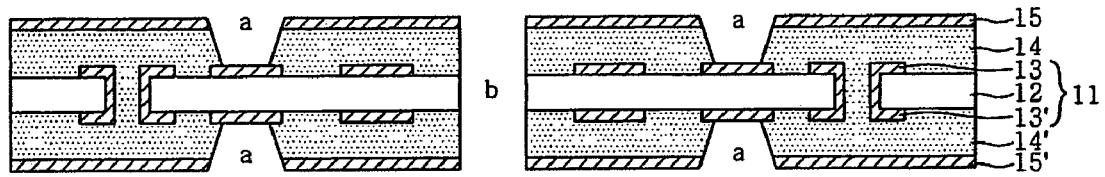
Figure 1C:
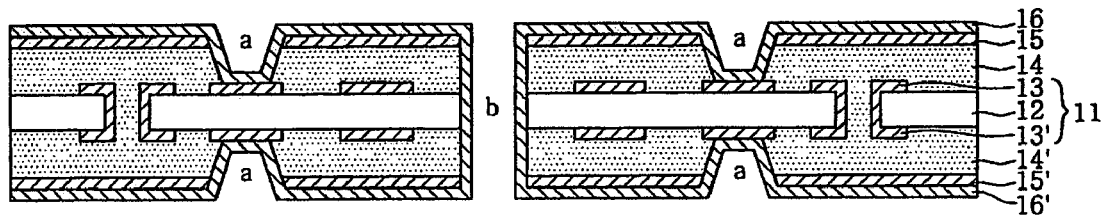
Figure 1D:
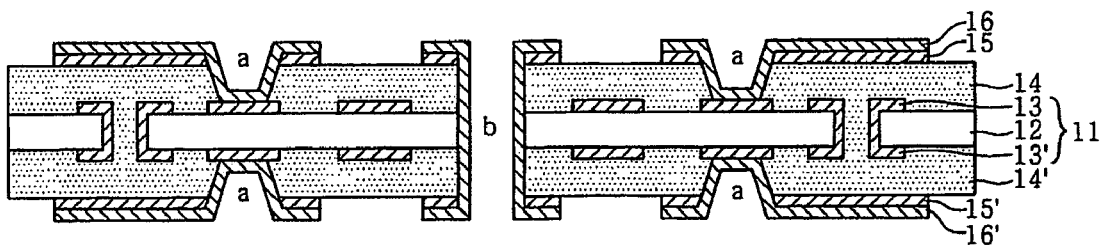
Figure 1E:
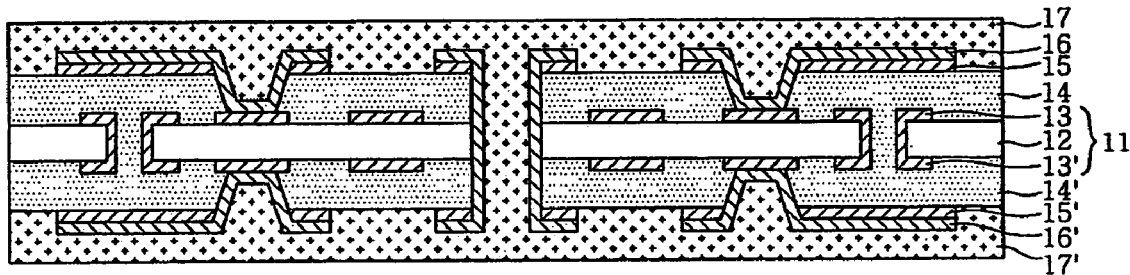
Figure 1F:
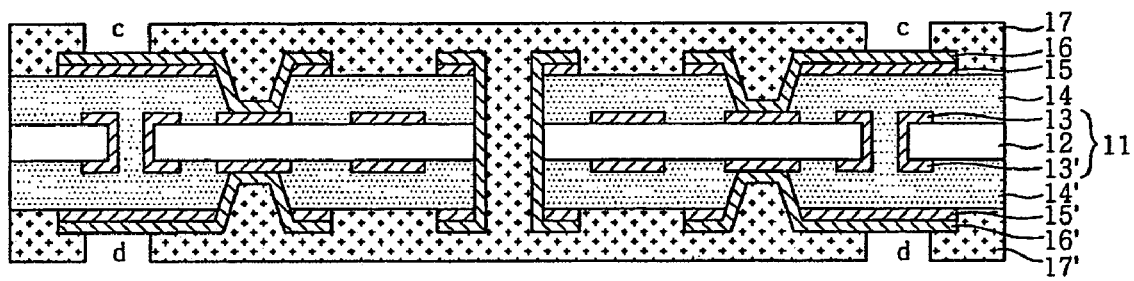
Figure 1G:
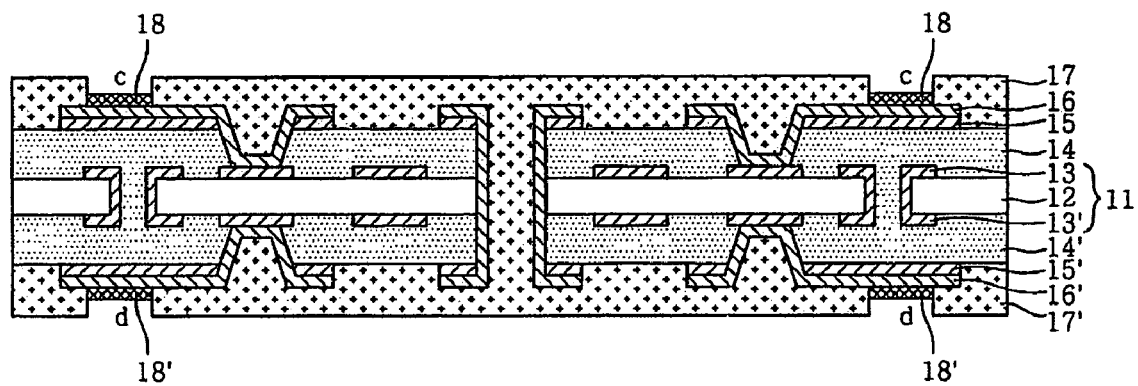
Figure 2:
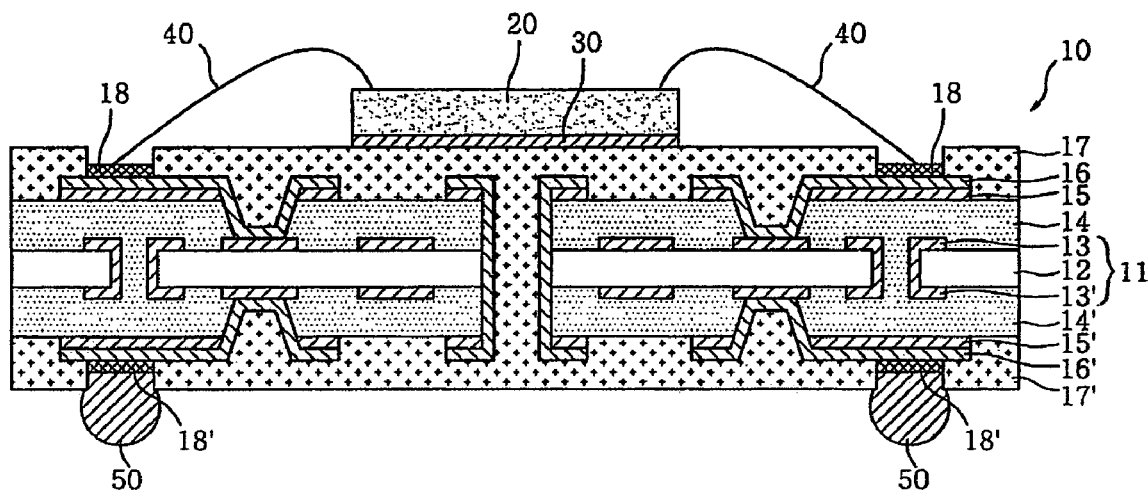
FIG. 2 is a sectional view of a conventional BGA package substrate on which a semiconductor device is mounted.
Figure 3:
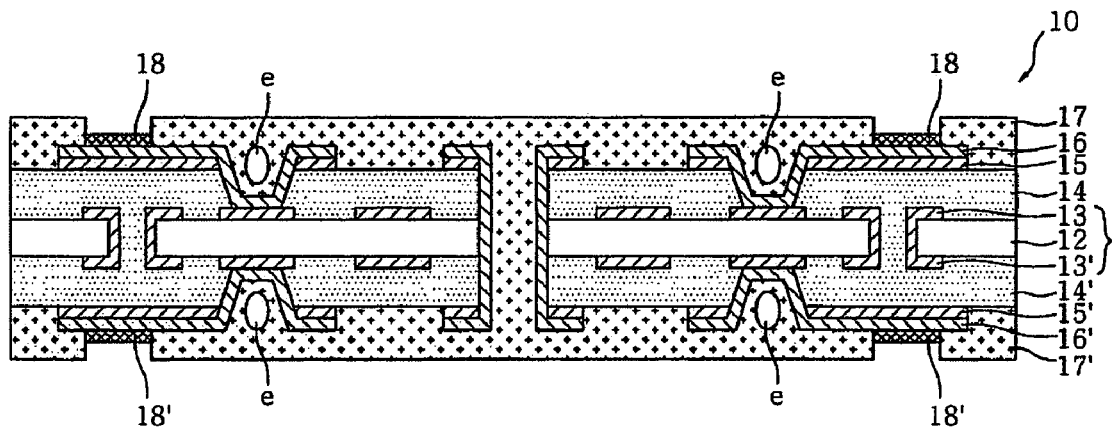
FIG. 3 illustrates a conventional inferior BGA package substrate.
Figure 4:
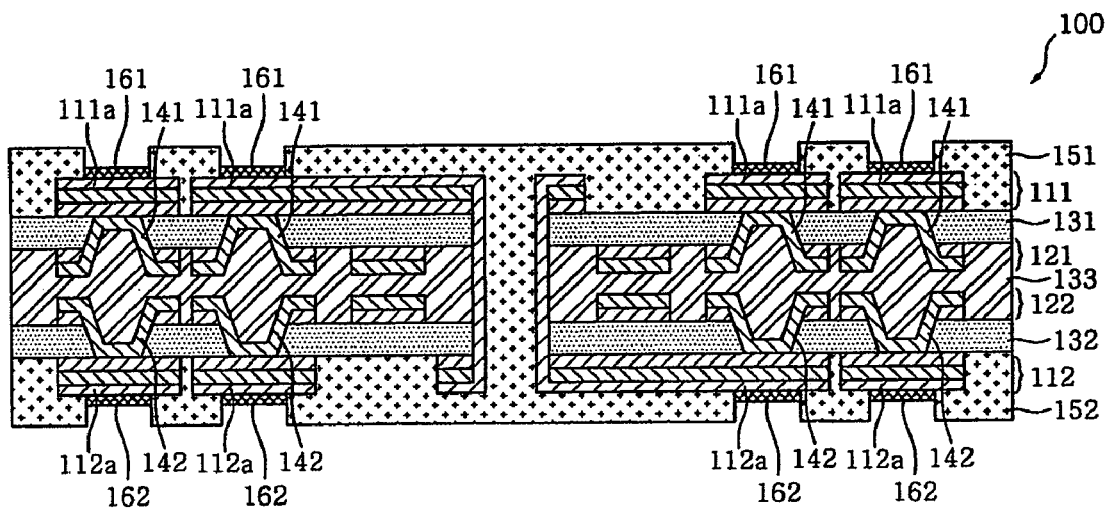
FIG. 4 is a sectional view of a BGA package substrate, according to an embodiment of the present invention.
Figure 5:
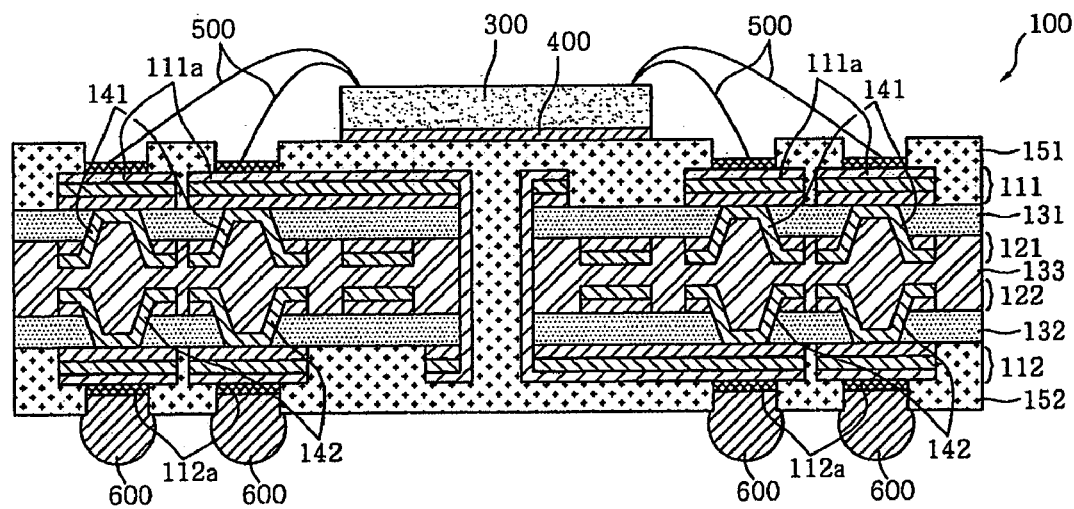
FIG. 5 is a sectional view of the BGA package substrate, on which a semiconductor device is mounted, according to an embodiment of the present invention.

FIG. 4 is a sectional view of a BGA package substrate, according to an embodiment of the present invention, and FIG. 5 is a sectional view of the BGA package substrate, on which a semiconductor device is mounted, according to an embodiment of the present invention.

As shown in FIG. 4, the BGA package substrate 100 according to the present invention is provided with a first external layer 111, a second external layer 112, a first internal layer 121, a second internal layer 122, a first insulating layer 131, a second insulating layer 132, a third insulating layer 133, first blind via holes 141, second blind via holes 142, an upper solder resist 151, and a lower solder resist 152.

A first external layer circuit pattern, which includes wire bonding pads 111a, is formed on the first external layer 111.

A second external layer circuit pattern, which includes solder ball pads 112a, is formed on the second external layer 112.

The first internal layer 121 is close to the first external layer 111, and a first internal layer circuit pattern is formed on the first internal layer 121.

The second internal layer 122 is close to the second external layer 112, and a second internal layer circuit pattern is formed on the second internal layer 122.

The first insulating layer 131 is interposed between the first external layer 111 and the first internal layer 121, and serves to insulate the first external layer 111 and the first internal layer 121 from each other.

The second insulating layer 132 is interposed between the second external layer 112 and the second internal layer 122, and serves to insulate the second external layer 112 and the second internal layer 122 from each other.

The third insulating layer 133 is interposed between the first internal layer 121 and the second internal layer 122, and serves to insulate the first internal layer 121 and the second internal layer 122 from each other.

In an embodiment of the present invention, a four-layered BGA package substrate 100 is illustrated. However, a BGA package substrate 100 having five or more layers may be employed, depending on the purpose and the application. In this case, at least one circuit layer having a predetermined circuit pattern is additionally contained in the third insulating layer 133.

Each of the first blind via holes 141 is formed through the first insulating layer 131. Each first blind via hole is open and connected to the first internal layer 121 through a wall thereof at a lower side thereof, and has a closed portion connected to the wire bonding pad 111a of the first external layer 111 at an upper side thereof. The wall of the first blind via hole is plated with a conductive material (for example, copper) to electrically connect the first internal layer 121 to the wire bonding pads 111a of the first external layer 111.

Each of the second blind via holes 142 is formed through the second insulating layer 132. Each second blind via hole is open and connected to the second internal layer 122 through a wall thereof at an upper side thereof, and has a closed portion connected to the solder ball pad 112a of the second external layer 112 at a lower side thereof. The wall of the second blind via hole is plated with conductive material (for example, copper) to electrically connect the second internal layer 122 to the solder ball pads 112a of the second external layer 112.

The upper solder resist 151 is formed on the first external layer 111 and the first insulating layer 131, and has openings corresponding in position to the wire bonding pads 111a. At this stage, the wire bonding pads 111a are subjected to surface treatment (for example, gold plating layers 161), thereby preventing oxidation.

The lower solder resist 152 is formed on the second external layer 112 and the second insulating layer 132, and has openings corresponding in position to the solder ball pads 112a. At this stage, the solder ball pads 111a are subjected to surface treatment (for example, gold plating layers 162), thereby preventing oxidation.

As described above, in the BGA package substrate 100 according to the present invention, the closed portions of the blind via holes 141, 142 are connected to the wire bonding pads 111a and the solder ball pads 112a, thereby achieving the formation of the wire bonding pads 111a and the solder ball pads 112a on the blind via holes 141, 142.

Accordingly, since the BGA package substrate 100 according to the present invention does not require separate spaces for receiving the blind via holes 141, 142 through the external layers 111, 112, freedom in design is increased and the formation of high density circuit patterns is made possible.

As shown in FIG. 5, in the BGA package substrate 100 according to the present invention, a semiconductor device 300 is mounted using an adhesive 400, wire bonds 500 are formed between wire bonding pads 111a and the semiconductor device 300, and solder balls 600 are formed on the solder ball pads 112a.

As shown in FIG. 5, in the BGA package substrate 100 according to the present invention, since it is unnecessary to form separate spaces for receiving first blind via holes 141 through a first external layer 111, it is possible to form the high density wire bonding pads 111a. Thus, it is possible to connect the wire bonding pads through the wire bonds 500 to the semiconductor device 300 having a large number of signal lines.

Furthermore, in the BGA package substrate 100 according to the present invention, since it is unnecessary to form separate spaces for receiving second blind via holes 142 through a second external layer 112, it is possible to form the high density solder ball pads 112a. Thus, it is possible to send/receive many electric signals using a mother board (not shown) and many solder balls 600.

FIGS. 6a to 6l are sectional views illustrating the fabrication of the BGA package substrate, according to an embodiment of the present invention.

Figure 6A:
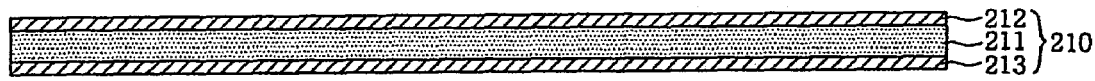
FIGS. 6a to 6l are sectional views illustrating the fabrication of the BGA package substrate, according to an embodiment of the present invention.

As shown in FIG. 6a, a copper clad laminate 210, in which copper foil layers 212, 213 are layered on both sides of an insulating resin layer 211, is prepared.

The copper clad laminate 210 may be classified into a glass/epoxy copper clad laminate, a heat-resistant resin copper clad laminate, a paper/phenol copper clad laminate, a high-frequency copper clad laminate, a flexible copper clad laminate, or a composite copper clad laminate, depending on the application.

Figure 6B:
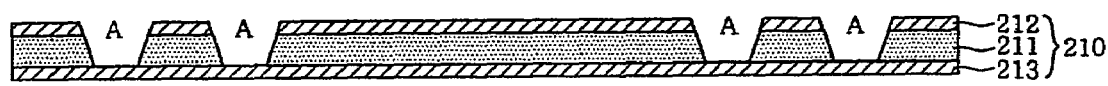

As shown in FIG. 6b, blind via holes (A) are formed using a laser to connect circuits of the upper and lower copper foil layers 212, 213 of the copper clad laminate 210 to each other.

Examples of the laser include a YAG laser (yttrium aluminum garnet laser) and a carbon dioxide laser ($CO_2$ laser).

When using the YAG laser, the upper copper foil layer 212 and the insulating resin layer 211 are simultaneously processed to form the blind via hole (A).

When using the carbon dioxide laser, portions of the upper copper foil layer 212, through which the blind via holes (A) are to be formed, are etched using a photolithography process, and the insulating resin layer 211 is then processed using the carbon dioxide laser to form the blind via holes (A).

After the formation of the blind via holes (A), it is preferable to further conduct a desmear process so as to remove a smear which is formed on walls of the blind via holes (A) by melting the insulating resin layer 211 due to heat generated in the course of forming the blind via holes.

Figure 6C:
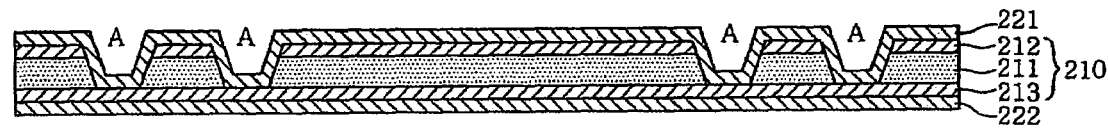

As shown in FIG. 6c, first copper plating layers 221, 222 are formed on the upper and lower copper foil layers 212, 213 of the copper clad laminate 210 and on the walls of the blind via holes (A) so as to electrically connect the blind via holes (A).

Since the walls of the blind via holes (A) of the copper clad laminate 210 each include the insulating resin layer 211, it is impossible to conduct an electrolytic copper plating process immediately. Accordingly, an electroless copper plating process is carried out so as to electrically connect the blind via holes (A) to each other and to make the electrolytic copper plating process possible.

For example, the electroless copper plating process may use a catalyst deposition method which includes a degreasing step, a soft etching step, a pre-catalyst treating step, a catalyst treating step, an acceleration step, an electroless copper plating step, and an anti-oxidizing step.

Alternatively, the electroless copper plating process may use a sputtering method, in which gas ion particles (for example, $Ar^+$), generated by a plasma or the like, collide with a copper target to form electroless copper plating layers on the upper and lower copper foil layers 212, 213 and on the walls of the blind via holes (A).

After the completion of the electroless copper plating process, the copper clad laminate 210 is dipped into a copper plating tub, and the electrolytic copper plating process is then conducted using a D.C. rectifier. Preferably, the electrolytic copper plating process is conducted in such a way that after an area to be plated is calculated, a proper amount of electricity is applied to the D.C. rectifier to achieve the deposition of copper.

Figure 6D:
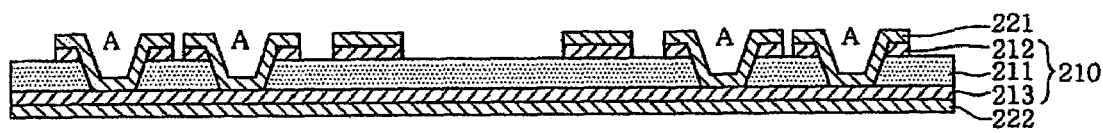

As shown in FIG. 6d, predetermined circuit patterns are formed on the upper copper foil layer 212 of the copper clad laminate 210 and on the first copper plating layer 221.

At this stage, it is preferable to form the predetermined circuit patterns on the upper copper foil layer 212 and the first copper plating layer 221 through a photolithography process using a dry film.

In this case, the dry film is applied on the upper first copper plating layer 221 of the copper clad laminate 210. The dry film is then exposed and developed using an artwork film having a predetermined pattern formed thereon, thereby forming a predetermined pattern on the dry film. Subsequently, the dry film having the predetermined pattern is used as an etching resist, and an etchant is sprayed on the upper copper foil layer 212 and the first copper plating layer 221, thereby etching portions of the upper copper foil layer 212 and the first copper plating layer 221, which do not correspond to the predetermined pattern of the dry film, to remove them. Next, the dry film is removed.

Figure 6E:
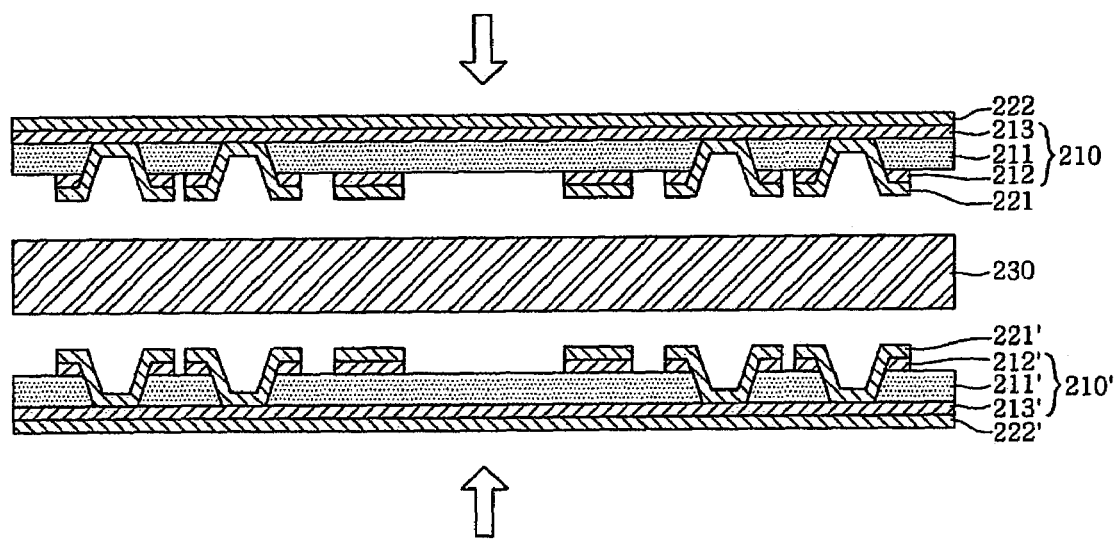

As shown in FIG. 6e, the procedure of FIGS. 6a to 6d is repeated to prepare another copper clad laminate 210' through which blind via holes are formed and which has a predetermined circuit pattern on a side thereof. The two copper clad laminates 210, 210' are then arranged so that open portions of the blind via holes (A) face each other. Subsequently, the two copper clad laminates 210, 210' and an insulating layer 230 are arranged while the insulating layer 230 is interposed between the two copper clad laminates 210, 210'.

Figure 6F:
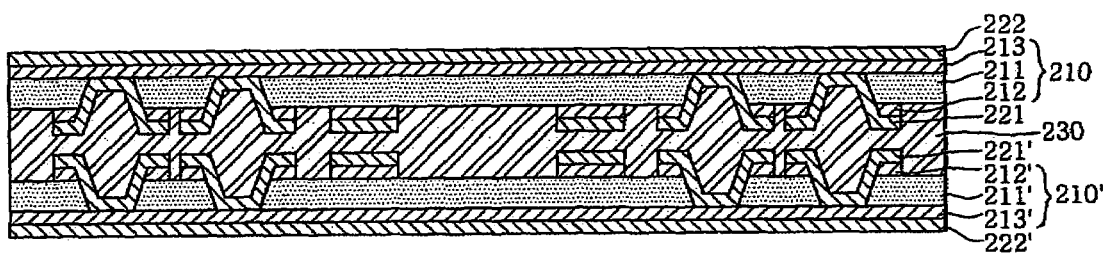

As shown in FIG. 6f, the copper clad laminates 210, 210' are laminated on both sides of the insulating layer 230 so that the open portions of the blind via holes (A) face the insulating layer 230.

It is preferable to use a press having a vacuum chamber in the procedure of FIGS. 6e and 6f. In this case, air is exhausted from the vacuum chamber using a vacuum pump, thereby removing air from the blind via holes (A). Hence, in a lamination process as shown in FIG. 6f, since the blind via holes (A) are completely filled with resin from the insulating layer 230, voids or dimples are not formed in the blind via holes (A).

Figure 6G:
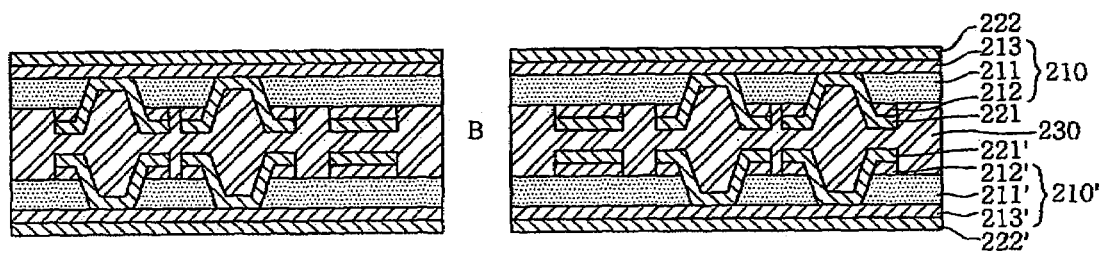

As shown in FIG. 6g, a through hole (B) is formed to connect circuits of the upper and lower copper foil layers 213, 213' and the first copper plating layers 222, 222' which are exposed and thus constitute external layers.

It is preferable that the through hole (B) be formed at a predetermined position using a CNC drill (computer numerical control drill).

Preferably, after the through hole (B) is formed using the CNC drill, a deburring process may be further conducted to remove burrs, generated during the drilling process, from the upper and lower copper foil layers 213, 213' and the first copper plating layers 222, 222', and dust adhering to a wall of the through hole (B) and to surfaces of the first copper plating layers 222, 222'. In this case, the surfaces of the first copper plating layers 222, 222' become rough, thus improving the adhesion strength of copper to the copper plating layers in a subsequent copper plating process.

More preferably, after the formation of the through hole (B) using the CNC drill, a desmear process may be further implemented so as to remove a smear which is formed on the wall of the through hole (B) by melting the insulating resin layers 211, 211' and the insulating layer 230 due to the heat generated during the drilling process.

Figure 6H:
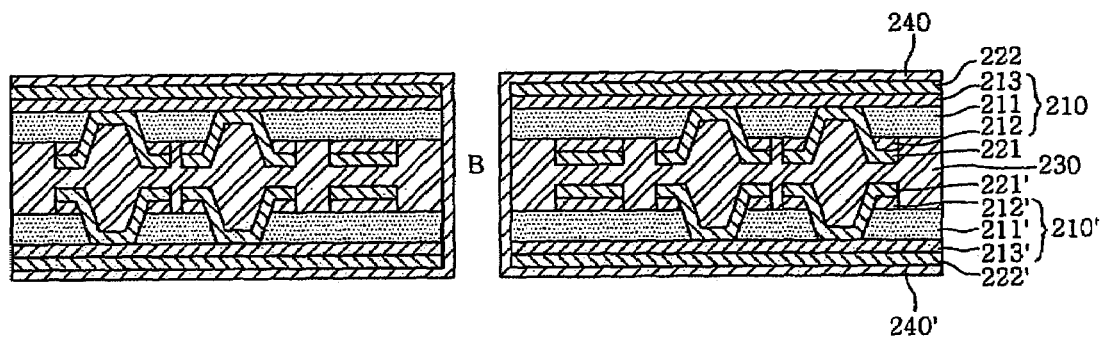

As shown in FIG. 6h, second copper plating layers 240, 240' are formed on the upper and lower first copper plating layers 222, 222' and on the wall of the through hole (B) to achieve the electrical connection of the through hole (B).

Since the wall of the through hole (B) includes the insulating resin layers 211, 211' and the insulating layer 230, it is preferable to conduct an electrolytic copper plating process after an electroless copper plating process, such as a catalyst deposition process or a sputtering process, has been implemented.

Figure 6I:
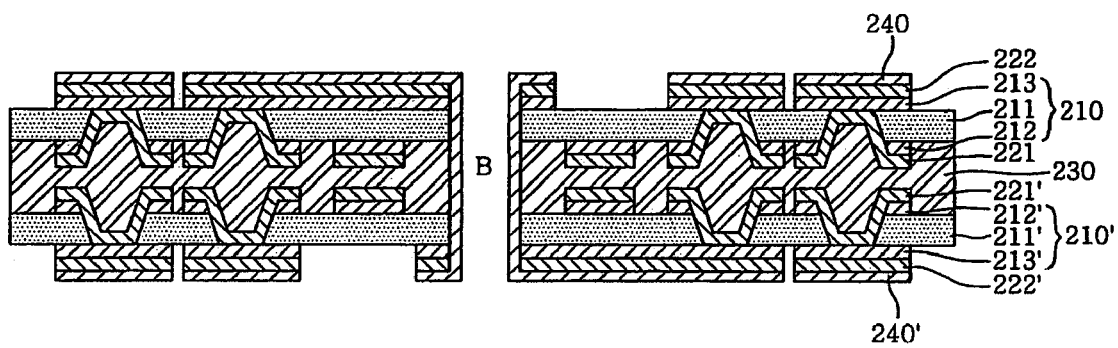

As shown in FIG. 6i, external layer circuit patterns are formed on the upper and lower copper foil layers 213, 213', the first copper plating layers 222, 222', and the second copper plating layers 240, 240'.

At this stage, it is preferable to form the external layer circuit patterns on the upper and lower copper foil layers 213, 213', the first copper plating layers 222, 222', and the second copper plating layers 240, 240' through a photolithography process using a dry film.

Figure 6J:
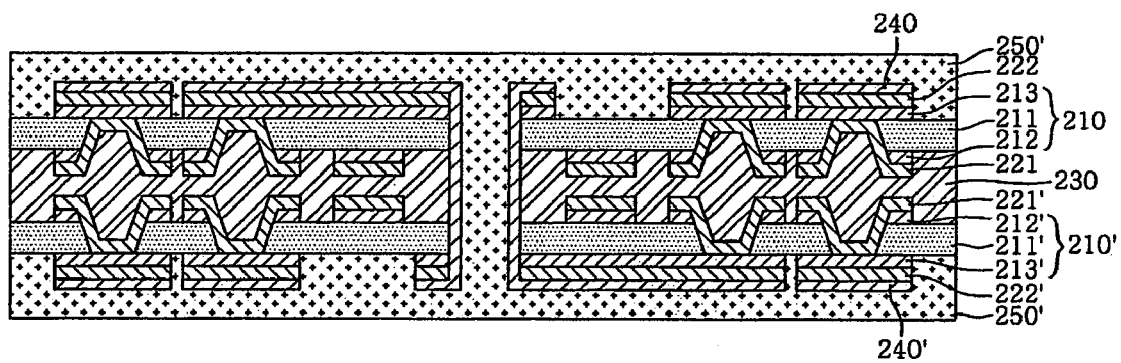

As shown in FIG. 6j, solder resists 250, 250' are applied on both sides of the substrate, on which the external layer circuit patterns are formed, and then subjected to a pseudo-drying process.

The application of the solder resists 250, 250' may be achieved through a screen printing process, a roller coating process, a curtain coating process, or a spray coating process.

If the substrate, on which the external layer circuit patterns are formed, is smeared with finger marks, oil, and dust, the solder resists 250, 250' may not completely adhere to the substrate. Therefore, before the solder resists 250, 250' are applied, it is preferable that the surface of the substrate be washed and pretreatments be conducted to make the surface of the substrate uneven so as to improve the adhesion strength between the solder resists 250, 250' and the substrate.

Figure 6K:
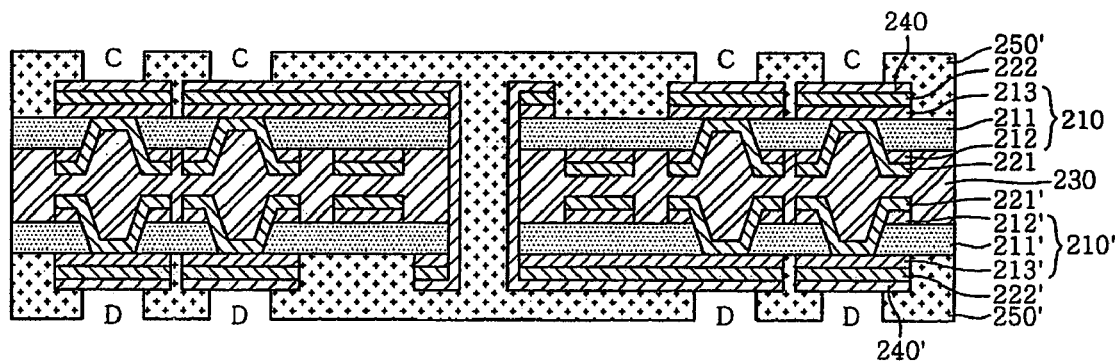

As shown in FIG. 6k, openings (C), which correspond in position to wire bonding pads, are formed through the upper solder resist 250, and openings (D), which correspond in position to solder ball pads, are formed through the lower solder resist 250'. Subsequently, ultraviolet rays are radiated onto the upper and lower solder resists 250, 250' to harden them, and the upper and lower solder resists are then completely hardened by heating.

At this stage, it is preferable to form the openings (C, D) through the upper and lower solder resists 250, 250' according to a photolithography process using a dry film.

It is preferable to further conduct a post-treatment process, in which residuals of the solder resists 250, 250' and impurities are removed using a plasma from the exposed wire bonding and solder ball pads corresponding to the openings (C, D) of the upper and lower solder resists 250, 250'.

Figure 6L:
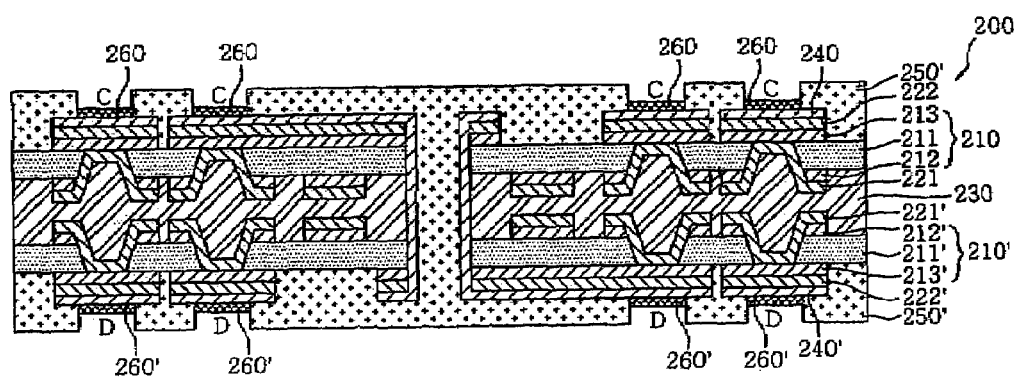

As shown in FIG. 6l, gold plating layers 260 are formed on the wire bonding pads, which correspond in position to the openings (C) of the upper solder resist 250, by surface treatment, and gold plating layers 260' are formed on the solder ball pads, which correspond in position to the openings (D) of the upper solder resist 250' by surface treatment.

Preferably, the substrate is dipped into a gold plating tub, and an electrolytic gold plating process is then conducted using a D.C. rectifier to form the gold plating layers 260, 260'. More preferably, the electrolytic gold plating process is conducted in such a way that after an area to be plated is calculated, a proper amount of electricity is applied to the D.C. rectifier to achieve the deposition of gold.

Additionally, in order to improve the adhesion strength to gold, it is preferable to form the gold plating layers 260, 260' after nickel has been thinly plated.

Subsequently, an exterior structure of the substrate is constructed using a router or a power press, thereby creating the BGA package substrate 200 according to the present invention.

Meanwhile, in a method of fabricating the BGA package substrate 200 according to the present invention, an etching resist may be applied on the lower copper foil layer 213 in the course of forming the first copper plating layers 221, 222 as shown in FIG. 6c, so that the lower copper plating layer 222 is not formed. In this case, the method is advantageous in that since only the upper and lower copper foil layers 213, 213' and the second copper plating layers 240, 240' are etched in the course of forming the external layer circuit patterns as shown in FIG. 6i, it is possible to form the micro external layer circuit patterns.

Figure 7A:
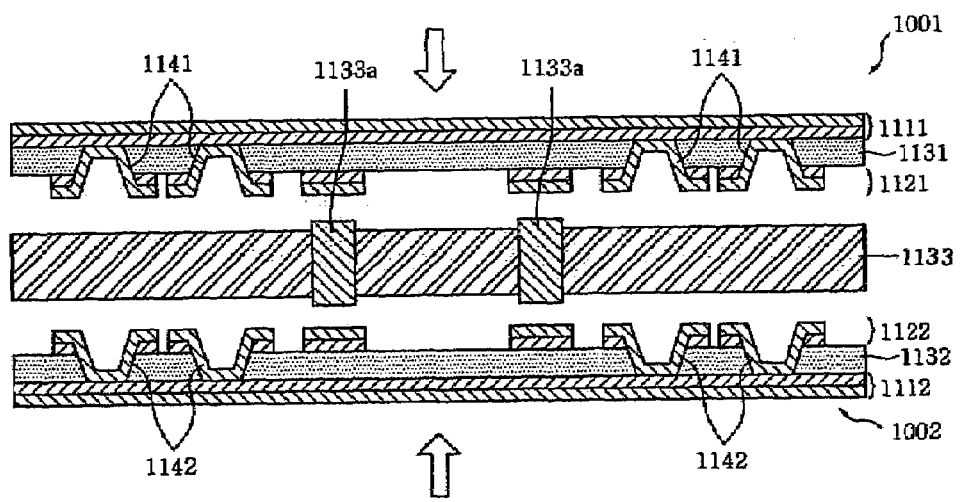
FIGS. 7a and 7b are sectional views illustrating the fabrication of a BGA package substrate, according to another embodiment of the present invention.
Figure 7B:
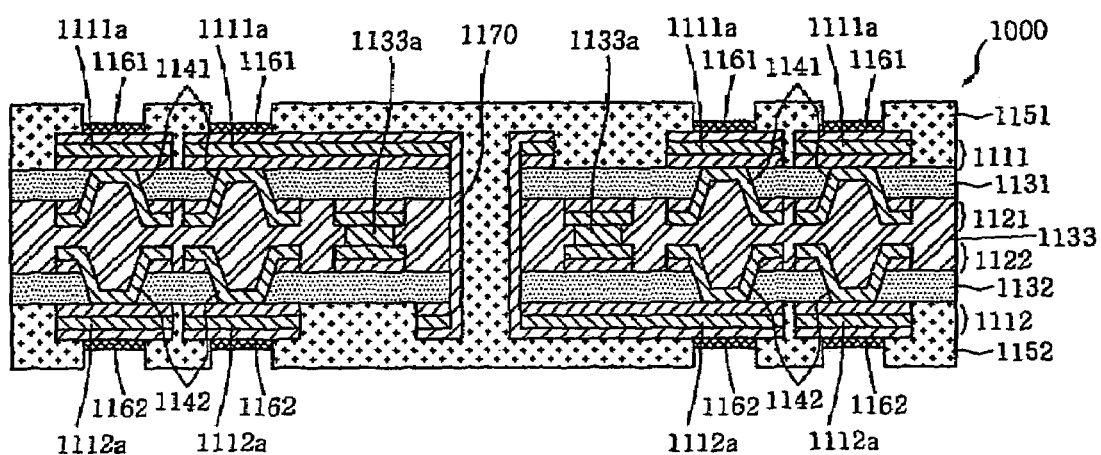

FIGS. 7a and 7b are sectional views illustrating the fabrication of a BGA package substrate, according to another embodiment of the present invention.

As shown in FIG. 7a, a first copper clad laminate 1001, in which a first external layer 1111 and a first internal layer 1121 having a predetermined circuit pattern are formed on both sides of a first insulating layer 1131 and in which first blind via holes 1141 are formed through the first insulating layer 1131, and a second copper clad laminate 1002, in which a second external layer 1112 and a second internal layer 1122 having a predetermined circuit pattern are formed on both sides of a second insulating layer 1132 and in which second blind via holes 1142 are formed through the second insulating layer 1132, are prepared. Subsequently, the two copper clad laminates 1001, 1002 are arranged so that open portions of the blind via holes 1141, 1142 face each other. Next, a third insulating layer 1133 is interposed between the two copper clad laminates 1001, 1002, and the copper clad laminates 1001, 1002 are laminated on both sides of the third insulating layer 1133.

At this stage, the third insulating layer 1133 includes connection parts 1133a into which a conductive paste is packed after through holes have been formed using a mechanical drill. The connection parts 1133a serve to electrically connect the first internal layer 1121 and the second internal layer 1122, which are respectively formed on the two copper clad laminates 1001, 1002, to each other.

As shown in FIG. 7b, formation of a through hole 1170 and a copper plating process, formation of predetermined circuit patterns on the first and second external layers 1111 and 1112, application of solder resists 1151, 1152, formation of openings of the solder resists 1151, 1152 which correspond in position to wire bonding pads 1111a and solder ball pads 1112a, and a gold plating process for the wire bonding pads 1111a and the solder ball pads 1112a are implemented, thereby creating the BGA package substrate 1000 according to the present invention.

As described above, the connection parts 1133a are formed through the third insulating layer 1133, making selective electric signal transmission between the first internal layer 1121 and the second internal layer 1122 possible.

Furthermore, in the BGA package substrate 1000 according to the present invention, it is possible to achieve electrical connection between the first external layer 1111 and the second external layer 1112, electrical connection between all of the circuit layers 1111, 1112, 1121, 1122, and electrical connection between two or more circuit layers among all of the circuit layers 1111, 1112, 1121, 1122 using the through hole 1170, a wall of which is plated with copper.

Meanwhile, materials of the copper foil layers or copper plating layers of the BGA package substrate according to the present invention are not limited to pure copper, but they consist of plating layers employing copper as a main component. This is confirmed by analyzing chemical compositions of the layers using analysis equipment, such as energy dispersive analysis of X-rays (EDAX).

Alternatively, the materials of the plating layers of the BGA package substrate according to the present invention are not limited to copper (Cu), but the plating layers may include a conductive material, such as gold (Au), nickel (Ni), or tin (Sn), as the main component, according to the purpose or the application.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As described above, a BGA package substrate and a method of fabricating the same according to the present invention are advantageous in that since a wire bonding pad and a solder ball pad are formed on via holes, it is unnecessary to form additional spaces for the blind via holes, making high freedom in design of a circuit pattern and formation of a high density circuit pattern possible.

Another advantage is that since lamination is conducted in a vacuum chamber, voids and dimples are not formed in the blind via holes.

What is claimed is:

1. A process of fabricating a ball grid array package substrate, comprising the steps, executed in the order listed, of:
   (A) forming a first blind via hole, opened at a side thereof and having a closed portion at an opposite side thereof, through a copper clad laminate using a laser;
   (B) forming first copper plating layers on copper foil layers and on a wall of the first blind via hole of the copper clad laminate, and forming a predetermined circuit pattern on the copper foil layer and the first copper plating layer, wherein the copper foil layer and the first copper plating layer are close to an open portion of the first blind via hole;
   (C) repeating the steps (A) to (B) to prepare another copper clad laminate which has a second blind via hole and a predetermined circuit pattern formed on a side thereof;
   (D) forming an insulating layer having at least one connection part formed in the insulating layer;
   (E) layering two copper clad laminates on both sides of the insulating layer so that open portions of the first and second blind via holes face the insulating layer, and pressing the two copper clad laminates and the insulating layer to achieve lamination;
   (F) forming a through hole through the copper foil layers and the first copper plating layers, wherein the copper foil layers and the first copper plating layers constitute external layers, of the two copper clad laminates;
   (G) forming second copper plating layers on the first copper plating layers and on a wall of the through hole, and forming external layer circuit patterns, wherein the external layer circuit patterns includes a wire bonding pad and a solder ball pad, on the copper foil layers, the first copper plating layers, and the second copper plating layers; and
   (H) layering solder resists on the external layer circuit patterns, and forming openings, wherein the openings correspond to the wire bonding pad and the solder ball pad, through the solder resists.

2. The method as set forth in claim 1, wherein step (C) further comprises the step of pressing and laminating the two copper clad laminates and the insulating layer in a vacuum chamber so that air is exhausted from the first and second blind via holes.

3. The method as set forth in claim 1, wherein step (G) further comprises the step of forming the wire bonding pad on the closed portion of the first blind via hole.

4. The method as set forth in claim 1, wherein step (G) further comprises the step of forming the solder ball pad on the closed portion of the second blind via hole.

5. The method as set forth in claim 1, wherein the at least one connection part electrically connects the first copper plating layer on the copper clad laminate that is close to (but does not contain) the open portion of the first blind via hole to the first copper plating layer on the other copper clad laminate that is close to the open portion of the second blind via hole.

6. The method as set forth in claim 1, wherein step (D) further comprises the steps of:
   forming at least one through hole in the insulating layer;
   inserting the at least one connection part in the at least one through hole; and
   packing a conductive paste into the at least one connection part.

\* \* \* \* \*